(12) United States Patent
Wen et al.

(10) Patent No.: US 11,161,734 B2
(45) Date of Patent: Nov. 2, 2021

(54) MEMS ASSEMBLY AND MANUFACTURING METHOD THEREOF

(71) Applicants: Hangzhou Silan Integrated Circuits Co., Ltd., Hangzhou (CN); Hangzhou Silan Microelectronics CO., LTD., Hangzhou (CN)

(72) Inventors: Yongxiang Wen, Hangzhou (CN); Chen Liu, Hangzhou (CN); Feng Ji, Zhejiang (CN); XiaoLi Zhang, Hangzhou (CN)

(73) Assignees: HANGZHOU SILAN INTEGRATED CIRCUITS CO., LTD., Hangzhou (CN); HANGZHOU SILAN MICROELECTRONICS CO., LTD., Hangzhou (CN)

( * ) Notice: Subject to any disclaimer, the term of this patent is extended or adjusted under 35 U.S.C. 154(b) by 60 days.

(21) Appl. No.: 16/603,349

(22) PCT Filed: Dec. 18, 2018

(86) PCT No.: PCT/CN2018/121699
§ 371 (c)(1),
(2) Date: Oct. 7, 2019

(87) PCT Pub. No.: WO2019/128769
PCT Pub. Date: Jul. 4, 2019

(65) Prior Publication Data
US 2020/0255286 A1 Aug. 13, 2020

(30) Foreign Application Priority Data
Dec. 29, 2017 (CN) .......................... 201711469518.X

(51) Int. Cl.
*B81B 7/02* (2006.01)
*B81C 3/00* (2006.01)

(52) U.S. Cl.
CPC ................ *B81B 7/02* (2013.01); *B81C 3/001* (2013.01); *B81B 2203/033* (2013.01); *B81B 2203/0315* (2013.01); *B81C 2203/035* (2013.01)

(58) Field of Classification Search
CPC .............. B81B 7/02; B81B 2203/0315; B81B 2203/033; B81B 2207/012; B81B 1/00;
(Continued)

(56) References Cited

U.S. PATENT DOCUMENTS 6,036,872 A * 3/2000 Wood ...................... B29C 43/56
216/2
8,049,287 B2 11/2011 Combi et al.
(Continued)

FOREIGN PATENT DOCUMENTS

CN 101331080 A 12/2008
CN 101698467 A 4/2010
(Continued)

OTHER PUBLICATIONS

CN-103818868 machine trnaslation (Year: 2014).*
(Continued)

*Primary Examiner* — Yasser A Abdelaziez
(74) *Attorney, Agent, or Firm* — Westman, Champlin & Koehler, P.A.

(57) ABSTRACT

Disclosed a MEMS assembly and a manufacturing method thereof. The manufacturing method comprises: forming a groove on a sensor chip; forming a bonding pad on a circuit chip; bonding the sensor chip and the circuit chip together to form a bonding assembly; performing a first dicing process at a first position of the sensor chip to penetrate through the sensor chip to the groove; performing a second dicing process at a second position of the sensor chip to penetrate through the sensor chip and the circuit chip, for obtaining an
(Continued)

individual MEMS assembly by singulating the bonding assembly, wherein location of the groove corresponds to a position of the bonding pad, and an opening is formed in the sensor chip to expose the bonding pad when the second dicing process is performed. The method uses two dicing process respectively achieving different depths to expose the bonding pad of the sensor chip and singulate the MEMS assembly, respectively, to improve yield and reliability.

11 Claims, 3 Drawing Sheets

(58) Field of Classification Search
CPC .............. B81C 3/001; B81C 2203/035; B81C 1/00888; B81C 1/00015; B81C 1/00063
See application file for complete search history.

(56) References Cited

U.S. PATENT DOCUMENTS

| | | | | |
|---|---|---|---|---|
| 2012/0299127 | A1* | 11/2012 | Fujii | B81B 7/02 |
| | | | | 257/415 |
| 2015/0357375 | A1* | 12/2015 | Tsai | B81C 1/00246 |
| | | | | 257/416 |
| 2015/0375995 | A1* | 12/2015 | Steimle | B81C 1/00246 |
| | | | | 257/418 |
| 2016/0363490 | A1 | 12/2016 | Campbell et al. | |
| 2017/0081176 | A1 | 3/2017 | Ji et al. | |

FOREIGN PATENT DOCUMENTS

| | | | |
|---|---|---|---|
| CN | 103395736 | A | 11/2013 |
| CN | 103482566 | A | 1/2014 |
| CN | 103818868 | * | 5/2014 |
| CN | 103818868 | A | 5/2014 |
| CN | 105197871 | A | 12/2015 |
| CN | 105236345 | A | 1/2016 |
| CN | 105428218 | A | 3/2016 |
| CN | 205115033 | U | 3/2016 |
| CN | 205115037 | U | 3/2016 |
| CN | 106115602 | A | 11/2016 |
| CN | 106115607 | A | 11/2016 |
| CN | 106365104 | A | 2/2017 |
| CN | 106365106 | A | 2/2017 |
| CN | 205917019 | U | 2/2017 |
| CN | 206014407 | U | 3/2017 |
| CN | 206203878 | U | 5/2017 |
| CN | 206203879 | U | 5/2017 |
| CN | 108117034 | A | 6/2018 |
| CN | 207986670 | U | 10/2018 |

OTHER PUBLICATIONS

International Search Report of the International Search Authority dated Mar. 21, 2019, for corresponding International Application PCT/CN2018/121699 filed Dec. 18, 2018.

* cited by examiner

MEMS ASSEMBLY AND MANUFACTURING METHOD THEREOF

CROSS-REFERENCE TO RELATED APPLICATION

This application is a Section 371 National Stage application of International Application No. PCT/CN2018/121699, filed on Dec. 18, 2018, which published as WO 2019/128769 A1 on Jul. 4, 2019, and claims priority to the Chinese Patent Application No. 201711469518.X, filed on Dec. 29, 2017, entitled as 'MEMS assembly and manufacturing method thereof', the contents of which are incorporated herein by reference in their entireties.

BACKGROUND OF THE DISCLOSURE

Field of the Disclosure

The present disclosure relates to the field of microelectronics and, more particularly, to a MEMS assembly and a manufacturing method thereof.

Description of the Related Art

MEMS assemblies are micro-electromechanical devices which are manufactured by using micromachining technology which is developed based upon microelectronics technology. They are widely used as sensors and actuators. For example, a MEMS assembly can be an accelerometer, a gyroscope, or a silicon condenser microphone.

A MEMS inertial sensor, including a mass (sensing element) and a detecting circuit, is configured to measure a physical quantity by using inertial force of the mass. According to different sensing principles, the MEMS inertial sensor typically has a piezoresistive structure, a capacitive structure, a piezoelectric structure, a tunnel-current type structure, a resonant type structure, a thermoelectric coupling structure, an electromagnetic structure or other structures. The MEMS inertial sensor can be used to form a low-cost INS/GPS integrated navigation system, which has broad potential application prospect in a variety of civil and military fields.

For example, the MEMS inertial sensor includes a sensor chip and a circuit chip assembled together to form a MEMS assembly, a mechanical structure is formed in the sensor chip, and a protective cavity is formed in the circuit chip for protecting the mechanical structure and providing space for forming a detecting circuit.

According to a manufacturing method of the MEMS assembly, the sensor chip is first fabricated, and then the sensor chip and the circuit chip are bonded together by a chip-bonding process to form the MEMS assembly. The mechanical structure of the sensor chip is sealed in the protective cavity of the circuit chip and bonding pads are exposed for external electrical connection.

Basic technologies of the manufacturing method mainly include a process for etching a wafer, the chip-bonding process for bonding the circuit chip and the sensor chip together, etc. In a step for wafer dicing, singulating the MEMS assembly comprising stacked chips is a technical difficulty, the bonding pads should be exposed for being soldered with lead wires and the sensor chip should be prevented from being damaged during dicing process.

Therefore, it is desirable to further improve the structure of the MEMS assembly to facilitate the dicing process, and thereby improve yield and reliability of the MEMS assembly.

SUMMARY OF THE DISCLOSURE

In view of this, an object of the present disclosure is to provide a MEMS assembly and a manufacturing method thereof, wherein a sensor chip and a circuit chip are bonded to form the MEMS assembly, and then two dicing processes achieving different depths are performed for exposing bonding pads of the sensor chip and singulating the MEMS assembly, so that the yield and the reliability of the MEMS assembly are improved.

One aspect of the disclosure, there is provided a manufacturing method for a MEMS assembly, comprises: forming a groove on a sensor chip; forming a bonding pad on a circuit chip; bonding the sensor chip and the circuit chip together during a bonding process to form a bonding assembly; performing a first dicing process at a first position of the sensor chip to penetrate through the sensor chip to reach the groove; performing a second dicing process at a second position of the sensor chip to penetrate through the sensor chip and the circuit chip and to obtain the individual MEMS assembly by singulating the bonding assembly, wherein positions of the groove and the bonding pad are corresponding to each other, and an opening is formed in the sensor chip to expose the bonding pad while the second dicing process is performed.

Preferably, the groove has a lateral dimension greater than that of the bonding pad.

Preferably, the bonding pad comprises a first side edge and a second side edge opposite to each other and a distance from each one of the first side edge and the second side edge to an edge of the groove is greater than or equal to 20 microns.

Preferably, the first position corresponding to the first dicing process is at a vertical distance greater than or equal to 20 microns from the first side edge, and the second position corresponding to the second dicing process is at a vertical distance greater than or equal to 20 microns from the second side edge.

Preferably, the groove has a depth of 50 microns to 100 microns.

Preferably, the manufacturing method further comprises: before the first dicing process, thinning at least one of a first substrate of the sensor chip and a second substrate of the circuit chip, such that a total thickness of the bonding assembly ranges from 400 microns to 500 microns.

Preferably, the sensor chip further comprises a sensor, and by the bonding process, an enclosed cavity is formed for accommodating the sensor.

Preferably, the bonding process comprises any one of a silicon-glass electrostatic bonding process, a silicon-silicon direct bonding process, a metal thermo-compression bonding process, and a metal solder bonding process.

Preferably, the bonding process is an aluminum germanium eutectic bonding process.

Preferably, each of the first dicing process and the second dicing process is performed by mechanical dicing using a dicing blade or laser dicing using a laser beam.

Preferably, the manufacturing method further comprises: after the second dicing process, soldering a lead on the bonding pad, wherein the bonding pad is adjacent to a sidewall of the opening.

On the other aspect of the disclosure, there is provided a MEMS assembly, comprising: a sensor chip, comprising a first bonding layer on its first surface and an opening penetrating through the sensor chip; a circuit chip comprising a second bonding layer and a bonding pad on its first surface, wherein, the first bonding layer and the second bonding layer are contacted and bonded with each other, and the bonding pad is exposed by the opening.

Preferably, the groove has a lateral dimension greater than that of the bonding pad.

Preferably, the bonding pad comprises a first side edge and a second side edge opposite to each other and a distance from each one of the first side edge and the second side edge to an edge of the groove is greater than or equal to 20 microns.

Preferably, a first position corresponding to the first dicing process is at a vertical distance greater than or equal to 20 microns from the first side edge, and the second position corresponding to the second dicing process is at a vertical distance greater than or equal to 20 microns from the second side edge.

Preferably, the groove has a depth of 50 microns to 100 microns.

Preferably, a total thickness of the MEMS assembly ranges from 400 microns and 500 microns.

Preferably, the sensor chip further comprises a sensor located in an enclosed cavity surrounded by the first bonding layer and the second bonding layer.

Preferably, each of the first bonding layer and the second bonding layer is made of any one selected from a group consisting of silicon, glass, metal, and alloy.

Preferably, the MEMS assembly further comprises a lead soldered to the bonding pad, wherein the bonding pad is adjacent to a sidewall of the opening.

Preferably, the MEMS assembly is any one selected from a group consisting of an accelerometer, a gyroscope, and a silicon condenser microphone.

According to the embodiment of the present disclosure, the groove is formed on the sensor chip, and after the sensor chip and the circuit chip are bonded together, the two dicing processes achieving different depths are performed via the groove, so that the opening is formed above the bonding pad while the MEMS assembly is obtained by dicing and singulating. The opening exposes the bonding pad of the circuit chip, to facilitate a subsequent lead-soldering process, and thus device reliability is improved. The present disclosed manufacturing method is a novel manufacturing method, which can improve yield and reliability.

Preferably, after the bonding process, substrate reduction is performed on both sides of the bonding assembly formed by the sensor chip and the circuit chip to improve efficiency of dicing and singulating, thereby reducing manufacturing cost to meet low-cost and mass production requirements.

BRIEF DESCRIPTION OF THE DRAWINGS

The above and other objects, advantages and features of the present disclosure will become more fully understandable from the detailed description given hereinbelow in connection with the appended drawings, and wherein.

DETAILED DESCRIPTION OF THE DISCLOSURE

Figure 1:
FIGS. 1 to 5 show cross-sectional diagrams of various stages of a manufacturing method of a MEMS assembly according to an embodiment of the present disclosure, respectively.

Exemplary embodiments of the present disclosure will be described in more details below with reference to the accompanying drawings. In the drawings, like reference numerals denote like members. The figures are not drawn to scale, for the sake of clarity. In addition, some well-known parts may not be shown in the figures.

Many specific details of the present disclosure are described below, such as the structures, materials, dimensions, processes, and techniques of the parts, in order to more clearly understand the present disclosure. However, one skilled in the art will understood that the present disclosure may be practiced without these specific details.

The present disclosure may be presented in various forms, some of which will be described below.

FIGS. 1 to 5 show cross-sectional diagrams of various stages of a manufacturing method of a MEMS assembly according to an embodiment of the present disclosure, respectively.

At the beginning, a sensor chip 110, as shown in FIG. 1, is described according to the manufacturing method. The sensor chip 110 comprises a substrate 101, a bonding layer 102, a groove 103, and a sensor 104.

The substrate 101 is, for example, a 100-oriented single crystal silicon substrate having a specific resistivity of, for example, 5 to 10 ohm-centimeters.

The sensor 104 is formed on a first surface of the substrate 101, and, for example, comprises a movable electrode (i.e., a mass) supported by a cantilever wall, and a fixed electrode disposed opposite to the movable electrode. When the movable electrode is displaced, an overlapping region or a spacing between the movable electrode and the fixed electrode is changed correspondingly, so that the detection of acceleration can be realized according to detected capacitance signals. Wires, which are not shown, may also be formed in the substrate 101 to provide electrical connections between the movable electrode, the fixed electrode, and bonding pads.

A bonding layer 102 is formed on the first surface of the substrate 101 for providing mechanical connection between the sensor chip and the circuit chip. For example, the bonding layer is made of any one selected from a group consisting of silicon, glass, metal, and alloy, thereby realizing silicon-glass electrostatic bonding, silicon-silicon direct bonding, metal thermo-compression bonding, or metal solder bonding. For example, eutectic bonding can be realized by using aluminum germanium alloy, the bonding layer 102 can be a single layer made of aluminum, or a laminated layer made of aluminum and germanium. Preferably, the bonding layer 102 is patterned into a plurality of bonding pads to provide both of electrical connection and mechanical fixation.

The groove 103 is, for example, an opening formed in the first surface of the substrate 101 by an etching process. A resist mask having an opening pattern is formed on the surface of the substrate by a photolithography method. The portion of the substrate 101 exposed by the opening pattern is removed by etchant during the etching process. A predetermined etching depth can be achieved by controlling the etching time. After the grooves 103 is formed, the resist mask is removed by solvent dissolution or ashing. In this embodiment, a lateral dimension of the groove 103 corresponds to a size of the bonding pad of the circuit chip and a depth of the groove 103 ranges from 50 microns to 100 microns approximately.

Figure 2:
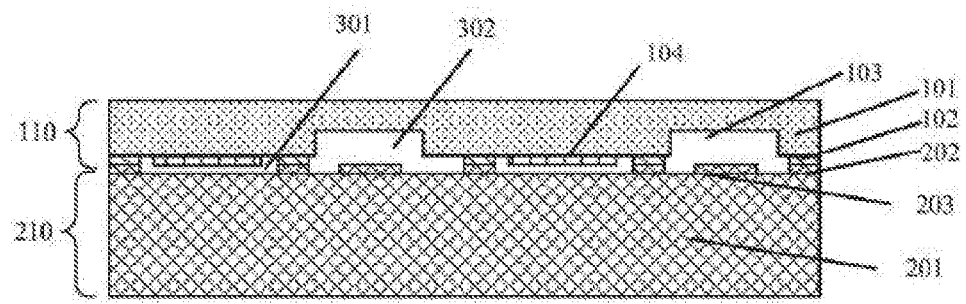

Then, the first surface of the sensor chip 110 and the first surface of the circuit chip 210 are opposite to each other and bonded together, as shown in FIG. 2. The circuit chip 210 includes a substrate 201, a bonding layer 202, and a bonding pad 203.

The substrate 201 is, for example, a 100-oriented single crystal silicon substrate having a specific resistivity of, for example, 5 to 10 ohm-centimeters. Although not shown, a plurality of transistors may be formed on the substrate 201 to constitute a detecting circuit. Further, the plurality of transistors are connected to the bonding layer 202 and the bonding pad 203, thus the plurality of transistors can be electrically connected to the sensor 104 in the sensor chip 110 via the bonding layer 202 and/or the bonding pad 203, and connected to an external circuit via the bonding pad 203.

The bonding layer 202 is formed on a first surface of the substrate 201 for providing mechanical connection between the sensor chip and the circuit chip. For example, the bonding layer is made of any one selected from a group consisting of silicon, glass, metal, and alloy, thereby achieving silicon-glass electrostatic bonding, silicon-silicon direct bonding, metal thermo-compression bonding, or metal solder bonding. The bonding layer 202 is, for example, a single layer made of aluminum, or a laminated layer made of aluminum and germanium. Preferably, the bonding layer 202 is patterned into a plurality of bonding pads to provide both of electrical connection and mechanical fixation.

In this embodiment, eutectic bonding is achieved by using aluminum-germanium alloy, thereby bonding the sensor chip 110 and the circuit chip 210 to each other. The eutectic bonding process can be compatible with existing CMOS processes. In the eutectic bonding process, the bonding layer 102 of the sensor chip 110 and the bonding layer 202 of the circuit chip 210 contact with each other, thereby defining a cavity 301 for accommodating the sensor 104, and a cavity 302 for accommodating the bonding pad 203. Preferably, the cavity 301 is an enclosed cavity, thereby preventing the sensor 104 from the influence which may be caused by external environment and result in poor working stability.

Figure 3:
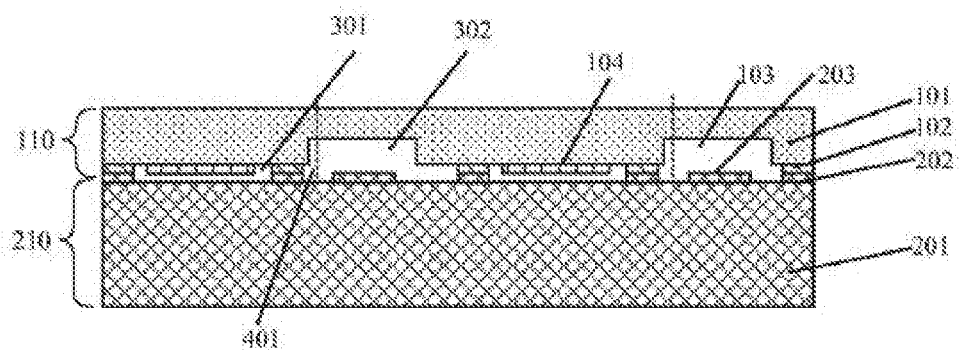

Then, the substrate 101 of the sensor chip 110 and the substrate 201 of the circuit chip 210 are respectively thinned to reduce substrate thickness, as shown in FIG. 3. For example, a second surface of the substrate 101 and a second surface of the substrate 201 are ground, wherein each of the second surfaces is opposite to a corresponding one of the first surfaces. After substrate thinning process, a total thickness of the bonding assembly comprising the sensor chip 110 and the circuit chip 210 is about 400 microns to 500 microns.

A dicing process is performed at a first position 401 on the second surface of the sensor chip 110.

The first position 401 is located at a vertical distance greater than or equal to 20 microns from a first side edge of the bonding pad 203 of the circuit chip 210 and is located within edges of the groove 302. The dicing process is configured to achieve a depth which is deep enough to reach the groove 302 and is 50 microns to 100 microns smaller than the thickness of the substrate 101 of the sensor chip 110, so that the depth achieved by the dicing process will not reach the first surface of the circuit chip 210.

In the dicing process, mechanical dicing may be performed by use of a dicing blade, or laser dicing may be performed by use of a laser beam.

Figure 4:
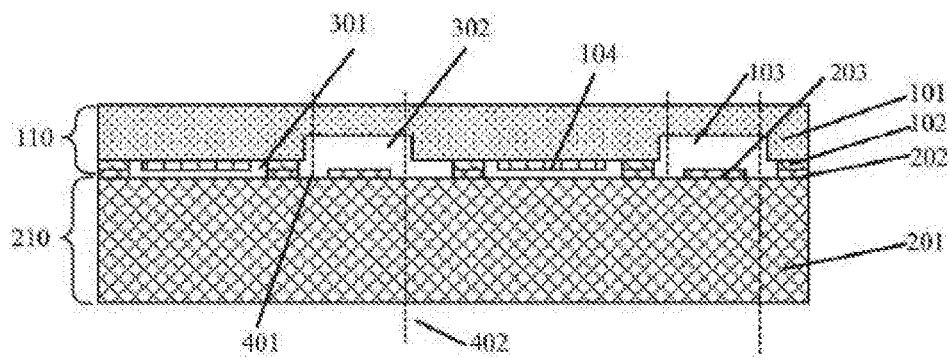
Figure 5:
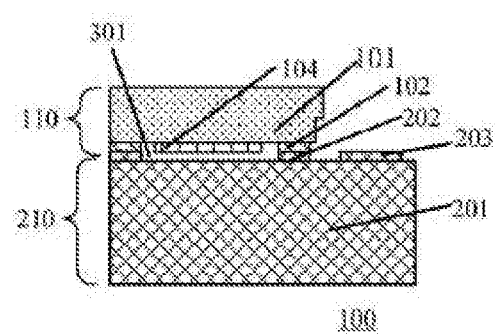

Then, another dicing process is performed at a second position 402 of the second surface of the sensor chip 110, as shown in FIG. 4.

The second position 402 is at a vertical distance greater than or equal to 20 microns from the second edge of the bonding pad 203 of the circuit chip 210 and is located within the edges of the groove 302. The first edge and the second edge of the bonding pad 203 are opposite to each other. The depth achieved by this dicing process is greater than the total thicknesses of the substrate 101 of the sensor chip 110 and the circuit chip 210, thereby completely penetrating through the bonding assembly.

In this dicing process, mechanical dicing may be performed by use of a dicing blade, or laser dicing may be performed by use of a laser beam.

In this dicing process, a portion of the substrate 101 of the sensor chip 110 located between the first position 401 and the second position 402 is also simultaneously removed, thereby the bonding pad 203 is completely exposed.

In a subsequent lead-soldering step, a lead can be directly connected to the corresponding bonding pad 203. The substrate 101 of the sensor chip 110 has sidewalls adjacent to the bonding pad 203, for facilitating alignment of the bonding pad and preventing the lead from contacting with the edges of the sensor chip 110, and thus yield and reliability are improved.

After this dicing process, an individual MEMS assembly 100 is obtained by singulating the bonding assembly along the dicing location 402.

The MEMS assembly 100 comprises the sensor chip 110 and the circuit chip 210. The sensor chip 101 comprises the substrate 101, the bonding layer 102, and the sensor 104. The circuit chip 210 comprises the substrate 201, the bonding layer 202, and the bonding pad 203.

The substrates 101 and 201 are, for example, a 100-oriented single crystal silicon substrate having a specific resistivity of, for example, 5 to 10 ohm-centimeters.

The sensor 104 is formed on the first surface of the substrate 101, and comprises, for example, a movable electrode (i.e., a mass) supported by a cantilever wall, and a fixed electrode disposed opposite to the movable electrode. When the movable electrode is displaced, the overlapping region or the spacing between the movable electrode and the fixed electrode is changed correspondingly, so that the detection of acceleration can be realized according to the detected capacitance signals. Although not shown, leads may also be formed in the substrate 101 to provide electrical connections between the movable electrode, the fixed electrode, and the bonding pad.

The bonding layers 102 and 202 are formed on the first surfaces of the substrates 101 and 201, respectively, for providing mechanical connection between the sensor chip and the circuit chip. For example, the bonding layer is made of any one selected from a group consisting of silicon, glass, metal, and alloy, thereby achieving silicon-glass electrostatic bonding, silicon-silicon direct bonding, metal thermo-compression bonding, or metal solder bonding. For example, eutectic bonding can be achieved by using aluminum-germanium alloy, and the bonding layers 102 and 202 are, for example, a single layer made of aluminum, or a laminated layer made of aluminum and germanium. Preferably, the bonding layers 102 and 202 are patterned into a plurality of bonding pads to provide both of electrical connection and mechanical fixation.

In this embodiment, eutectic bonding is performed by using aluminum-germanium alloy, thereby the sensor chip 110 and the circuit chip 210 can be bonded to each other. The eutectic bonding process is compatible with existing CMOS processes. In the eutectic bonding process, the bonding layer 102 of the sensor chip 110 and the bonding layer 202 of the circuit chip 210 contact with each other, thereby defining the cavity 301 for accommodating the sensor 104. Preferably, the cavity 301 is an enclosed cavity, thereby preventing the sensor 104 from the influence which may be caused by external environment and may result in poor working stability. The substrate 101 of the sensor chip 110 forms an opening above the bonding pad 203, thereby exposing the bonding pad 203 for lead soldering.

The substrate 101 of the sensor chip 110 has sidewalls adjacent to the bonding pad 203, for facilitating alignment of the bonding pad and preventing the lead from contacting with the edges of the sensor chip 110, and thus the yield and reliability are improved.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present disclosure are described above, these embodiments neither present all details, nor imply that the present disclosure is limited to these embodiments. Obviously, many modifications and changes may be made in light of the teaching of the above embodiments. These embodiments are presented and some details are described herein only for explaining the principle of the disclosure and its actual use, so that one skilled person can practice the present disclosure and introduce some modifications in light of the disclosure. The disclosure is intended to cover alternatives, modifications and equivalents that may be included within the spirit and scope of the disclosure as defined by the appended claims.

The invention claimed is:

1. A manufacturing method of a MEMS assembly, comprising:
   forming a groove on a first surface of a sensor chip;
   forming a bonding pad on a flat part of a first surface of a circuit chip;
   bonding said sensor chip and said circuit chip together to form a bonding assembly by a bonding process, said first surface of said sensor chip and said first surface of said circuit chip contact with each other;
   performing a first dicing process at a first position of said sensor chip to penetrate through said sensor chip to said groove;
   performing a second dicing process at a second position of said sensor chip to penetrate through said sensor chip and said circuit chip, for obtaining an individual MEMS assembly by singulating said bonding assembly,
   wherein location of said groove corresponds to a position of said bonding pad, and an opening is formed in said sensor chip to expose said bonding pad while said second dicing process is performed.

2. The manufacturing method according to claim 1, wherein said groove has a lateral dimension greater than that of said bonding pad.

3. The manufacturing method according to claim 2, wherein said bonding pad comprises a first side edge and a second side edge opposite to each other, and a distance from each one of said first side edge and said second side edge to an edge of said groove is greater than or equal to 20 microns.

4. The manufacturing method according to claim 3, wherein said first position corresponding to said first dicing process is at a vertical distance greater than or equal to 20 microns from said first side edge, and said second position corresponding to said second dicing process is at a vertical distance greater than or equal to 20 microns from said second side edge.

5. The manufacturing method according to claim 1, wherein said groove has a depth of 50 microns to 100 microns.

6. The manufacturing method according to claim 1, further comprising: before said first dicing process, thinning at least one of a first substrate of said sensor chip and a second substrate of said circuit chip, such that a total thickness of said bonding assembly ranges from 400 microns to 500 microns.

7. The manufacturing method according to claim 1, wherein said sensor chip further comprises a sensor, and by said bonding process, an enclosed cavity is formed for accommodating said sensor.

8. The manufacturing method according to claim 1, wherein said bonding process comprises any one of a silicon-glass electrostatic bonding process, a silicon-silicon direct bonding process, a metal thermo-compression bonding process, and a metal solder bonding process.

9. The manufacturing method according to claim 8, wherein said bonding process is an aluminum germanium eutectic bonding process.

10. The manufacturing method according to claim 1, wherein each one of said first dicing process and said second dicing process comprises a mechanical dicing process by use a dicing blade or a laser dicing process by use of a laser beam.

11. The manufacturing method according to claim 1, after said second dicing process, wherein said bonding pad is adjacent to a sidewall of said opening.

* * * * *